(12) United States Patent
Kim et al.

(10) Patent No.: US 9,455,121 B2
(45) Date of Patent: Sep. 27, 2016

(54) SEMICONDUCTOR INSPECTION SYSTEM AND METHODS OF INSPECTING A SEMICONDUCTOR DEVICE USING THE SAME

(71) Applicants: Hyunwoo Kim, Chungju-si (KR); Wooseok Ko, Seoul (KR); Minkook Kim, Goyang-si (KR); Jung Hwan Kim, Pyeongtaek-si (KR); Yusin Yang, Seoul (KR); Sangkil Lee, Yongin-si (KR); Chungsam Jun, Suwon-si (KR)

(72) Inventors: Hyunwoo Kim, Chungju-si (KR); Wooseok Ko, Seoul (KR); Minkook Kim, Goyang-si (KR); Jung Hwan Kim, Pyeongtaek-si (KR); Yusin Yang, Seoul (KR); Sangkil Lee, Yongin-si (KR); Chungsam Jun, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/828,021

(22) Filed: Aug. 17, 2015

(65) Prior Publication Data

US 2016/0086769 A1   Mar. 24, 2016

(30) Foreign Application Priority Data

Sep. 19, 2014   (KR) .......................... 10-2014-0125085

(51) Int. Cl.
*H01J 37/30*      (2006.01)
*H01J 37/305*     (2006.01)
*H01J 37/285*     (2006.01)
*H01J 37/28*      (2006.01)

(52) U.S. Cl.
CPC ............ *H01J 37/3005* (2013.01); *H01J 37/28* (2013.01); *H01J 37/285* (2013.01); *H01J 37/3053* (2013.01); *H01J 2237/2812* (2013.01); *H01J 2237/3174* (2013.01)

(58) Field of Classification Search
CPC .... H01J 37/28; H01J 37/3005; H01J 37/285; H01J 37/3053; H01J 2237/2812; H01J 2237/3174; H01J 49/142; H01J 2237/0812
See application file for complete search history.

(56) References Cited

U.S. PATENT DOCUMENTS

| | | | |
|---|---|---|---|
| 5,814,194 A * | 9/1998 | Deguchi ................. | C30B 33/00 204/192.1 |
| 5,851,413 A * | 12/1998 | Casella ............... | H01J 37/3002 156/345.33 |
| 7,247,867 B2 | 7/2007 | Itokawa et al. | |
| 7,714,280 B2 * | 5/2010 | Komatsu ............... | H01J 49/142 250/287 |
| 8,178,857 B2 * | 5/2012 | Sato .......................... | C23F 4/00 216/58 |
| 8,319,178 B2 | 11/2012 | Murakami | |
| 8,481,959 B2 | 7/2013 | Ruffell | |

(Continued)

FOREIGN PATENT DOCUMENTS

JP      2011117826 A    6/2011

OTHER PUBLICATIONS

Toyoda, N., et al., "Secondary Ion Mass Spectrometry with Gas Cluster Ion Beams," Nucl. Instr. And Meth. in Phys. Res. B 190 (2002).*

(Continued)

*Primary Examiner* — Wyatt Stoffa
(74) *Attorney, Agent, or Firm* — Harness, Dickey & Pierce, P.L.C.

(57) ABSTRACT

A semiconductor inspection system including an ion beam milling unit configured to irradiate at least one cluster-ion beam onto a surface of a sample wafer and etch the surface of the sample wafer and an image acquisition unit configured to irradiate an electron beam onto the etched surface of the sample wafer and acquire an image of the etched surface may be provided.

18 Claims, 14 Drawing Sheets

(56) References Cited

U.S. PATENT DOCUMENTS

| | | | |
|---|---|---|---|
| 8,637,808 B2 | 1/2014 | Kyogaku et al. | |
| 8,816,303 B2 * | 8/2014 | Biberger | H01J 37/3005 250/306 |
| 8,835,880 B2 * | 9/2014 | Chandler | H01J 37/3056 250/492.1 |
| 8,884,248 B2 | 11/2014 | Mulders et al. | |
| 2002/0017455 A1 * | 2/2002 | Kirkpatrick | A61F 2/30767 204/192.34 |
| 2003/0021908 A1 | 1/2003 | Nickel et al. | |
| 2003/0109092 A1 * | 6/2003 | Choi | H01J 37/317 438/200 |
| 2005/0200841 A1 * | 9/2005 | Talbot | G06T 7/0004 356/237.4 |
| 2005/0231856 A1 * | 10/2005 | Kao | B82Y 10/00 360/324.11 |
| 2006/0278611 A1 * | 12/2006 | Sato | C23F 4/00 216/66 |
| 2007/0284695 A1 * | 12/2007 | Zani | B82Y 10/00 257/607 |
| 2008/0042057 A1 * | 2/2008 | Sanada | B82Y 15/00 250/305 |
| 2008/0185517 A1 * | 8/2008 | Frosien | H01J 37/3056 250/289 |
| 2008/0232001 A1 * | 9/2008 | Bonhote | G11B 5/11 360/319 |
| 2008/0277576 A1 * | 11/2008 | Komatsu | H01J 49/142 250/287 |
| 2009/0037015 A1 * | 2/2009 | Hofmeester | C23C 14/221 700/110 |
| 2009/0152457 A1 | 6/2009 | Niehuis et al. | |
| 2010/0096263 A1 * | 4/2010 | Sato | H01J 37/08 204/298.36 |
| 2010/0126001 A1 * | 5/2010 | Bonhote | G11B 5/11 29/603.07 |
| 2011/0163068 A1 * | 7/2011 | Utlaut | G03F 1/84 216/66 |
| 2011/0248156 A1 * | 10/2011 | Komatsu | H01J 49/0463 250/251 |
| 2012/0252222 A1 * | 10/2012 | Gumpher | H01L 21/26506 438/758 |
| 2013/0105302 A1 | 5/2013 | Nanri et al. | |
| 2013/0196509 A1 * | 8/2013 | Tabat | C23F 4/00 438/709 |
| 2013/0273737 A1 | 10/2013 | Alptekin et al. | |
| 2014/0011346 A1 | 1/2014 | Byl et al. | |
| 2014/0138533 A1 * | 5/2014 | Iwasaki | H01J 37/05 250/282 |
| 2014/0236295 A1 * | 8/2014 | Khoury | A61F 2/28 623/13.11 |
| 2014/0299465 A1 * | 10/2014 | Sato | C23F 4/00 204/192.34 |
| 2014/0319333 A1 * | 10/2014 | Blenkinsopp | H01J 27/026 250/282 |
| 2014/0363978 A1 * | 12/2014 | Martin | H01J 37/3053 438/712 |
| 2015/0144786 A1 * | 5/2015 | Gwinn | H01J 37/30 250/307 |
| 2015/0155132 A1 * | 6/2015 | Aoki | H01J 49/0004 250/306 |
| 2015/0206732 A1 * | 7/2015 | Sakai | G01N 23/02 378/64 |

OTHER PUBLICATIONS

Webb, A.P., "In Situ Monitoring during ion beam processing of multi-layer epitaxial III-V device structures," Semicond. Sci. Technol. 2 (1988) 463-465.*

Yamada, Matsuo, Toyoda, Cluster ion beam process technology, 2003, 10 pages, Elsevier Science B.V., Kyoto, Japan.

* cited by examiner

First Etch Depth

Second Etch Depth

SEMICONDUCTOR INSPECTION SYSTEM AND METHODS OF INSPECTING A SEMICONDUCTOR DEVICE USING THE SAME

CROSS-REFERENCE TO RELATED APPLICATIONS

This U.S. non-provisional patent application claims priority under 35 U.S.C. §119 to Korean Patent Application No. 10-2014-0125085, filed on Sep. 19, 2014, in the Korean Intellectual Property Office, the entire contents of which are hereby incorporated by reference.

BACKGROUND OF THE INVENTION

Example embodiments of the inventive concepts relate to semiconductor inspection systems and/or methods of inspecting a semiconductor device using the same.

Due to their small-sized, multifunctional, and/or low-cost characteristics, semiconductor devices are used as important elements in the electronics industry. The semiconductor devices may be fabricated using various processes such as photolithography, etching, deposition, ion implantation, and cleaning processes.

An inspection process may be performed to examine whether there is any failure in patterns constituting a fabricated semiconductor device. By performing the inspection process, a process condition of the fabrication process can be improved and any failure in a semiconductor device can be identified in an early stage.

As the semiconductor device is scaled down, demand for a method and a system capable of reliably measuring fine patterns in the semiconductor device is increasing.

SUMMARY

Some example embodiments of the inventive concepts provide inspection systems and/or methods capable of performing a high-speed, large-area destructive inspection on a semiconductor device.

Other example embodiments of the inventive concepts provide inspection systems and/or methods capable of inspecting a semiconductor device with improved inspection reliability.

According to an example embodiment, a semiconductor inspection system includes an ion beam milling unit configured to irradiate at least one cluster-ion beam onto a surface of a sample wafer and etch the surface of the sample wafer, and an image acquisition unit configured to irradiate an electron beam onto the etched surface of the sample wafer and acquire an image of the etched surface.

In some example embodiments, the ion beam milling unit may be configured to irradiate a plurality of cluster-ion beams including the at least one cluster-ion beam, the cluster-ion beams may include a first cluster-ion beam and a second cluster-ion beam, and the first cluster-ion beam may be used to etch the surface of the sample wafer, and the second cluster-ion beam may have an energy lower than that of the first cluster-ion beam and is used to planarize the etched surface of the sample wafer.

In some example embodiments, the image acquisition unit may be a scanning electron microscope (SEM).

In some example embodiments, the semiconductor inspection system may further include a mass spectrometry unit that is configured to measure a mass spectrum of secondary electrons produced from the sample wafer, while the surface of the sample wafer is etched.

In some example embodiments, the mass spectrometry unit may be a quadrupole mass spectrometer.

In some example embodiments, the semiconductor inspection system may further include a vacuum chamber configured to accommodate the ion beam milling unit, the image acquisition unit, and the mass spectrometry unit therein.

In some example embodiments, the semiconductor inspection system may further include a stage in the vacuum chamber and may be configured to receive the sample wafer. The image acquisition unit may be over a top surface of the stage and spaced apart from the stage in a first direction.

In some example embodiments, the ion beam milling unit may be over the top surface of the stage and be configured to incline with respect to the top surface of the stage in a second direction inclined at a first angle with respect to the first direction.

In some example embodiments, the mass spectrometry unit may be over the top surface of the stage and be configured to incline with respect to the top surface of the stage in a third direction inclined at a second angle with respect to the first direction, and the ion beam milling unit and the mass spectrometry unit may be configured to face each other with respect to the image acquisition unit.

In some example embodiments, the ion beam milling unit and the mass spectrometry unit may be arranged in a fourth direction that is orthogonal to the first direction, the fourth direction may be inclined with respect to the second and third directions, and the stage may be configured to have a rotating axis in the fourth direction and be rotatable about the rotating axis within a specific angle range.

In some example embodiments, the stage may be movable in the first direction.

In some example embodiments, the semiconductor inspection system may further include a wafer handling unit associated with the vacuum chamber.

In some example embodiments, the semiconductor inspection system may further include a load-lock chamber connecting the vacuum chamber to the wafer handling unit. The wafer handling unit may include a load port and a robot system. The load port may be configured to load the sample wafer supplied from an outside therein, and the robot system may be configured to deliver the sample wafer loaded in the load port to the load-lock chamber.

In some example embodiments, the semiconductor inspection system may further include a controller coupled to the ion beam milling unit and the mass spectrometry unit. The controller may be configured to detect an etch stop material from the mass spectrum measured by the mass spectrometry unit and may control the ion beam milling unit such that the etching of the sample wafer is terminated when a detected intensity of the etch stop material is within a detection rage.

According to an example embodiment, a method of inspecting a semiconductor device includes etching an inspection-target region of a sample wafer by irradiating a first cluster-ion beam onto a surface of the sample wafer, planarizing an etched surface of the inspection-target region by irradiating a second cluster-ion beam onto the etched surface, and acquiring an image of the etched surface by irradiating an electron beam onto the etched surface. The second cluster-ion beam may have an energy lower than that of the first cluster-ion beam.

In some example embodiments, the etching of an inspection-target region may include measuring in real-time a mass spectrum of secondary electrons emitted from the inspection-target region, while a surface of the inspection-target region is etched, obtaining, using the mass spectrum, information on a surface material of the inspection-target region according to an etch depth of the inspection-target region, determining whether an etch stop material is detected by analyzing the obtained information, and terminating the etching when the etch stop material is detected.

In some example embodiments, the measuring may be performed using a quadrupole mass spectrometer.

In some example embodiments, the obtaining may include analyzing the mass spectrum to determine ingredients of the surface material according to the etch depth of the inspection-target region, obtaining a variation in detection intensity of a material according to the etch depth of the inspection-target region, the detection intensity corresponding to a mass-to-charge ratio obtained from the mass spectrum data, and obtaining a mass distribution image of the material according to the etch depth of the inspection-target region, the mass distribution image corresponding to the mass-to-charge ratio.

In some example embodiments, the determining may include determining whether the etch stop material is contained in the surface material, determining whether the detection intensity of the etch stop material is within a detection range, when the etch stop material is contained in the surface material, and producing a detection signal, when the detection intensity of the etch stop material is within the detection range.

In some example embodiments, the determining may further include determining whether the mass distribution image of the etch stop material is obtained at a detection position of the inspection-target region, when the detection intensity of the etch stop material is within the detection range, and wherein the producing a detection signal may produce the detection signal when the mass distribution image of the etch stop material is obtained at the detection position of the inspection-target region.

In some example embodiments, the etching an inspection-target region may include compensating a difference in process starting time between the etching an inspection-target region and the measuring a mass spectrum of the secondary ions, using a difference between expected and real etch depths of the inspection-target region.

In some example embodiments, the terminating the etching may include decreasing a beam current of the first cluster-ion beam in a gradual or stepwise manner.

In some example embodiments, the acquiring an image of the etched surface may be performed by a scanning electron microscope (SEM).

According to an example embodiment, a semiconductor inspection system include an ion beam milling unit configured to etch an inspection-target region of a sample wafer by irradiating a first cluster-ion beam thereon and planarize a surface of the inspection-target region by irradiating a second cluster-ion beam thereon, an image acquisition unit configured to acquire an image of the planarized surface of the sample wafer by irradiating an electron beam thereon, and a mass spectrometry unit configured to measure a mass spectrum of secondary electrons from a surface of the sample wafer, while the surface of the sample wafer is etched.

In some example embodiments, the semiconductor inspection system may further include a controller configured to compensate a time difference between the etching of the inspection-target region of the sample wafer and the measuring of the mass spectrum of the secondary ions from a surface of the sample wafer based on a difference between expected and real etch depths of the inspection-target region.

In some example embodiments, the semiconductor inspection system may further include a controller configured to detect an etch stop material from the mass spectrum of secondary electrons measured by the mass spectrometry unit and control the ion beam milling unit such that the etching of the sample wafer is terminated when a detected intensity of the etch stop material is within a detection rage In some example embodiments, the second cluster-ion beam may have an energy lower than that of the first cluster-ion beam.

In some example embodiments, the semiconductor inspection system may further include a stage configured to receive the sample wafer thereon. The ion beam milling unit, the image acquisition unit, and the mass spectrometry unit may be arranged over the stage in a first direction.

In some example embodiments, the stage may be configured to move in a second direction perpendicular to the first direction.

In some example embodiments, the stage may be configured to rotate about an axis of rotation in the first direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
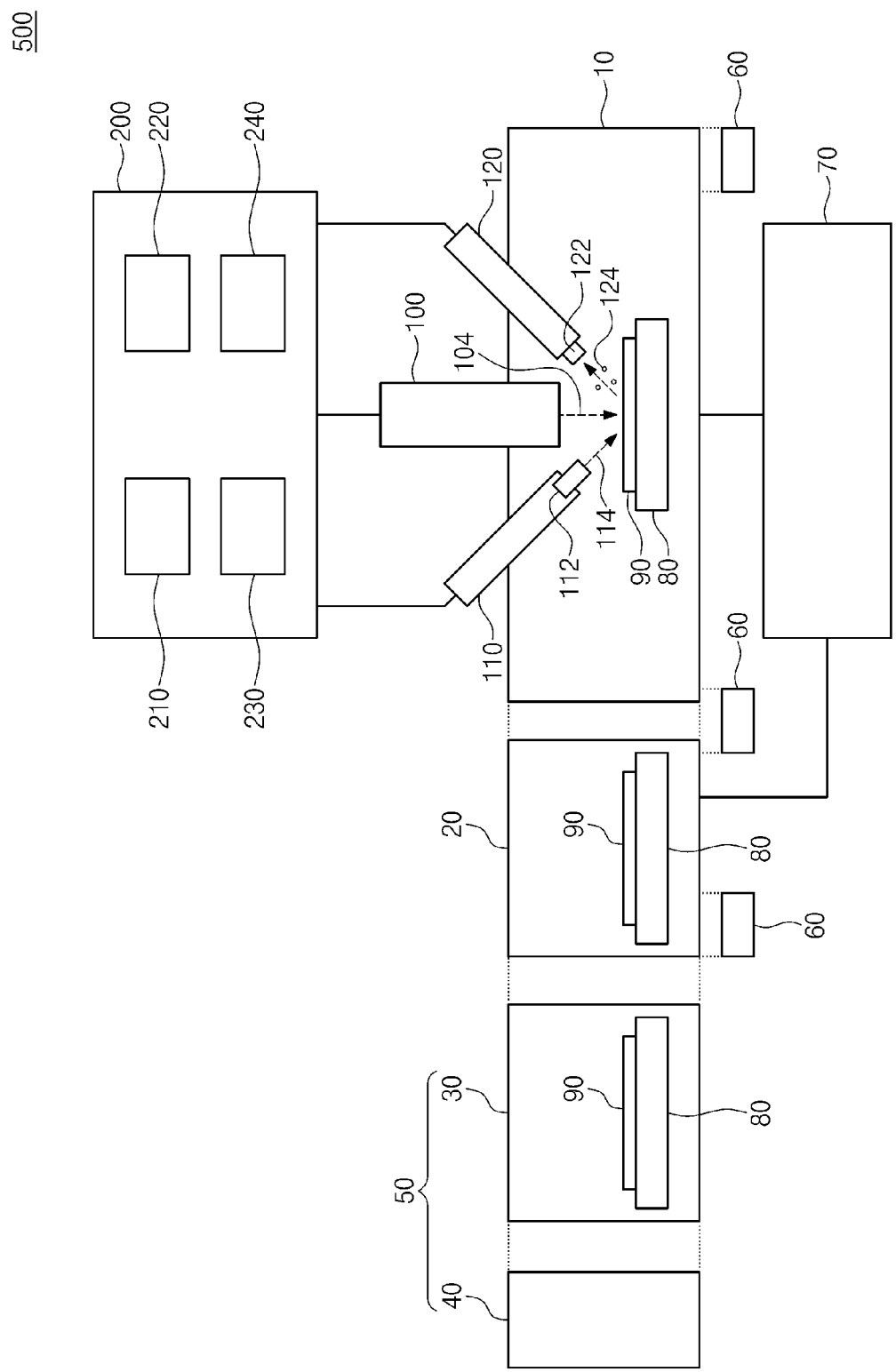
FIG. 1 is a schematic diagram illustrating a semiconductor inspection system according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which various example embodiments are shown. Example embodiments of the inventive concepts may, however, be embodied in many different forms and should not be construed as being limited to the example embodiments set forth herein; rather, these example embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic diagram illustrating a semiconductor inspection system according to an example embodiment of the inventive concepts.

Referring to FIG. 1, a semiconductor inspection system 500 may include a vacuum chamber 10, in which a destructive inspection on a sample wafer 90 is to be performed, and a load-lock chamber 20, which is connected to the vacuum chamber 10 to provide a pathway for transferring the sample wafer 90 to the vacuum chamber 10. The sample wafer 90 may include a plurality of patterns constituting a semiconductor device. The sample wafer 90 may be transferred from the load-lock chamber 20 to the vacuum chamber 10 or from the vacuum chamber 10 to the load-lock chamber 20 through a door (not shown) provided between the load-lock chamber 20 and the vacuum chamber 10. Each of the vacuum and load-lock chambers 10 and 20 may include a stage 80, on which the sample wafer 90 is loaded.

The semiconductor inspection system 500 may further include a wafer handling unit 50 coupled to the load-lock chamber 20. The wafer handling unit 50 may be connected to the vacuum chamber 10 through the load-lock chamber 20. The wafer handling unit 50 may include a load port 40, which is used to load the sample wafer 90 from the outside of the semiconductor inspection system 500, and a robot system 30, which is used to deliver the sample wafer 90 loaded in the load port 40 to the load-lock chamber 20. The sample wafer 90 may be transferred from the load-lock chamber 20 to the robot system 30 or from the robot system 30 to the load-lock chamber 20 through a door (not shown) provided between the load-lock chamber 20 and the robot system 30. The robot system 30 may include a stage 80, on which the sample wafer 90 is loaded.

The semiconductor inspection system 500 may further include a vacuum system 70 for controlling an internal pressure (i.e., vacuum state) of each of the vacuum and load-lock chambers 10 and 20 and a vibration-isolation system 60 for preventing the vacuum and load-lock chambers 10 and 20 from being vibrated.

The semiconductor inspection system 500 may further include an image acquisition unit 100, an ion beam milling unit 110, and a mass spectrometry unit 120. The ion beam milling unit 110 may be configured to etch a surface of the sample wafer 90 using a cluster-ion beam 114. The image acquisition unit 100 may be configured to irradiate an electron beam 104 onto the etched surface of the sample wafer 90 and acquire images of the etched surface of the sample wafer 90. The mass spectrometry unit 120 may be configured to analyze a mass spectrum of secondary ions 124 emitted from the sample wafer 90, while the surface of the sample wafer 90 is etched. The ion beam milling unit 110 may include an emitting part 112 for emitting the cluster-ion beam 114, and the mass spectrometry unit 120 may include a detecting part 122 for detecting the secondary ions 124. Positions of the emitting and detecting parts 112 and 122 may be finely adjusted to increase detection efficiency in a process of detecting the secondary ions 124. The image acquisition unit 100 may be, for example, a scanning electron microscope (SEM), and the mass spectrometry unit 120 may be, for example, a quadrupole mass spectrometer. The image acquisition unit 100, the ion beam milling unit 110, and the mass spectrometry unit 120 may be coupled to the vacuum chamber 10.

Figure 2:
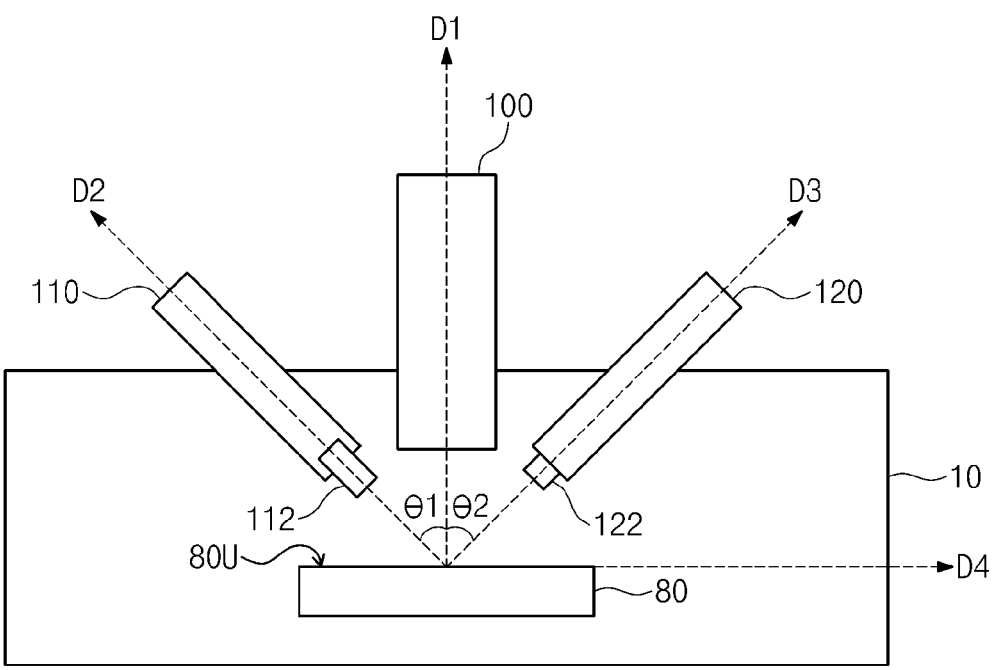
FIG. 2 is a schematic diagram illustrating an example configuration of an image acquisition unit, an ion beam milling unit, and a mass spectrometry unit of FIG. 1.
Figure 2:
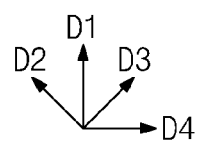

FIG. 2 is a schematic diagram exemplarily illustrating an example configuration of the image acquisition unit, the ion beam milling unit, and the mass spectrometry unit of FIG. 1.

Referring to FIG. 2, the image acquisition unit 100 may be disposed on a top surface 80U of the stage 80, which is provided in the vacuum chamber 10, and may be spaced apart from the stage 80 in a first direction D1. The first direction D1 may be in a vertical axis of the vacuum chamber 10 and/or be perpendicular to the top surface 80U of the stage 80.

The ion beam milling unit 110 may be disposed on the top surface 80U of the stage 80 and may be disposed to incline with respect to the top surface 80U of the stage 80 in a second direction D2 crossing the first direction D1. In some example embodiments, the second direction D2 may be inclined at a first angle $\theta 1$ with respect to the first direction D1. For example, the first angle $\theta 1$ may be one of 30, 45, or 60 degrees. The emitting part 112 of the ion beam milling unit 110 may be disposed adjacent to the top surface 80U of the stage 80.

The mass spectrometry unit 120 may be disposed on the top surface 80U of the stage 80 and may be disposed to incline with respect to the top surface 80U of the stage 80 in a third direction D3 crossing both the first and second directions D1 and D2. The third direction D3 may be inclined at a second angle $\theta 2$ with respect to the first direction D1. The first angle $\theta 1$ may be equal to or different from the second angle $\theta 2$. As an example, the second angle $\theta 2$ may be 45 degrees. The image acquisition unit 100 may be disposed between the mass spectrometry unit 120 and the ion beam milling unit 110. The ion beam milling unit 110 and the mass spectrometry unit 120 may be spaced apart from each other in a fourth direction D4 which is perpendicular to the first direction D1 and is inclined at an angle with respect to the second and third directions D2 and D3. The fourth direction D4 may be parallel to the top surface 80U of the stage 80. The detecting part 122 of the mass spectrometry unit 120 may be disposed to be adjacent to the top surface 80U of the stage 80.

Figure 3:
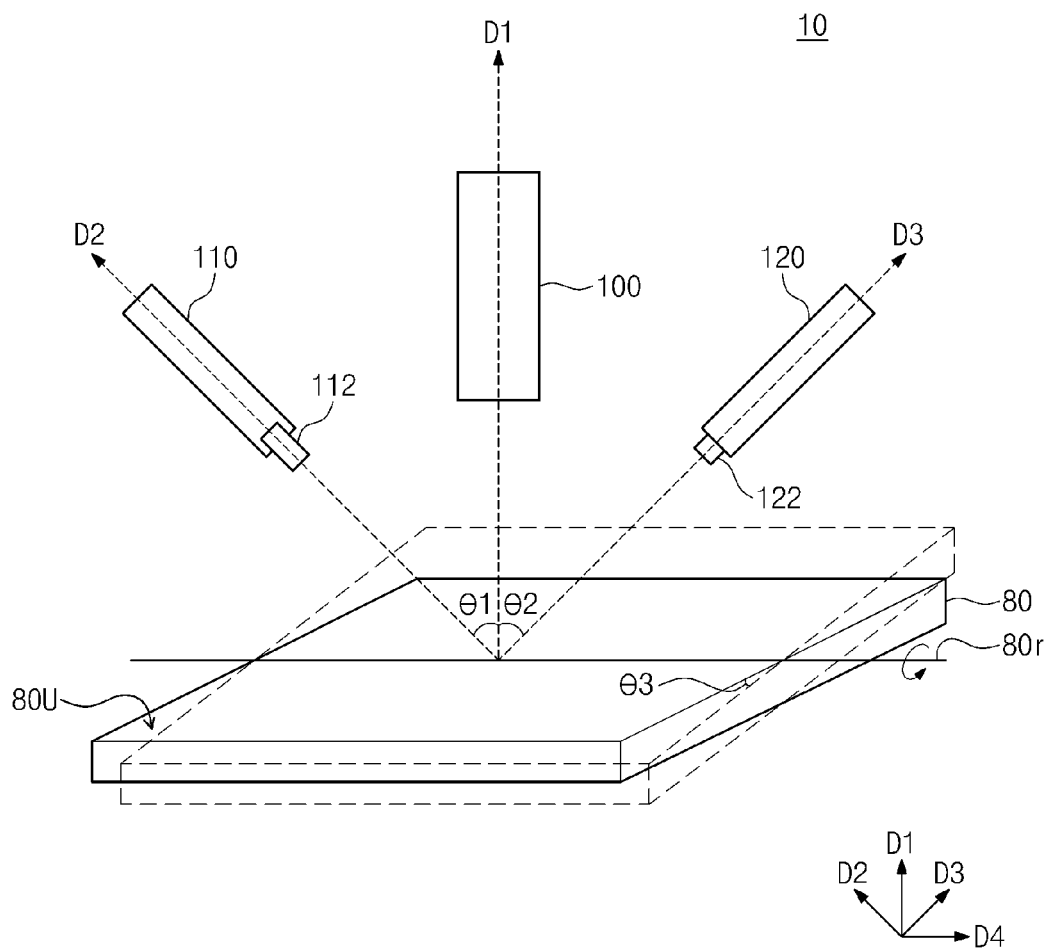
FIG. 3 and FIG. 4 are schematic diagrams illustrating a stage provided in a vacuum chamber of FIG. 1.
Figure 4:
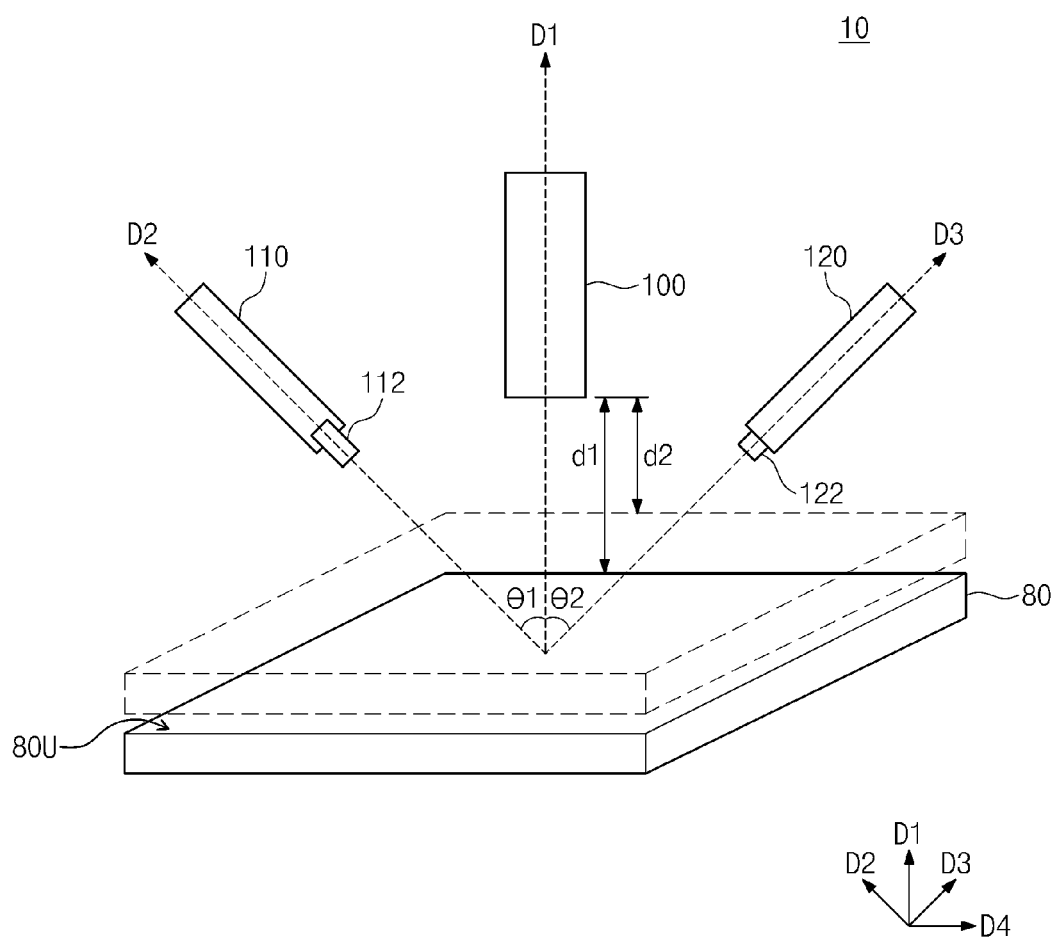

FIG. 3 and FIG. 4 are schematic diagrams illustrating the stage provided in the vacuum chamber of FIG. 1.

Referring to FIG. 3, in the vacuum chamber 10, the stage 80 may be inclined in a specific direction. For example, the stage 80 in the vacuum chamber 10 may be configured to rotate about a rotating axis 80r parallel to the fourth direction D4. The stage 80 may move or rotate about the rotating axis 80r by a third angle $\theta 3$ in a clockwise or counterclockwise direction. In some example embodiments, the third angle $\theta 3$ may be greater than 0 degree and smaller than 90 degrees.

Referring to FIG. 4, in the vacuum chamber 10, the stage 80 may be movable in the first direction D1 (e.g., in the vertical direction of the vacuum chamber 10). For example, in a stage, the top surface 80U of the stage 80 may be spaced apart from the image acquisition unit 100 by a first distance d1, and in another stage, the top surface 80U of the stage 80 may be spaced apart from the image acquisition unit 100 by a second distance d2. The first and second distances d1 and d2 may be values measured in the first direction D1. In some example embodiments, the second distance d2 may be smaller than the first distance d1. Because the stage 80 is movable in the first direction D1, a distance between the top surface 80U of the stage 80 and the image acquisition unit 100, for example, may be adjusted in a range from d1 to d2.

Figure 5A:
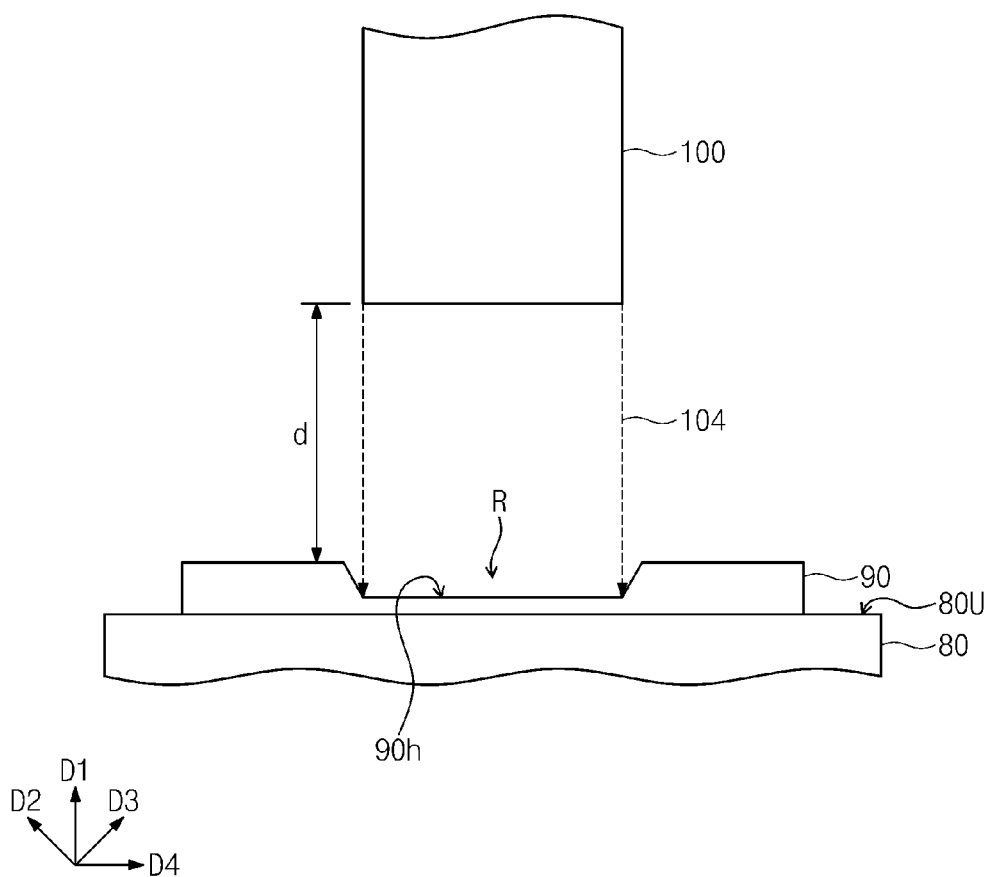
FIGS. 5A and 5B are example schematic diagrams illustrating relation between a movement of the stage and a variation in section of a sample wafer to be measured by the image acquisition unit.
Figure 5B:
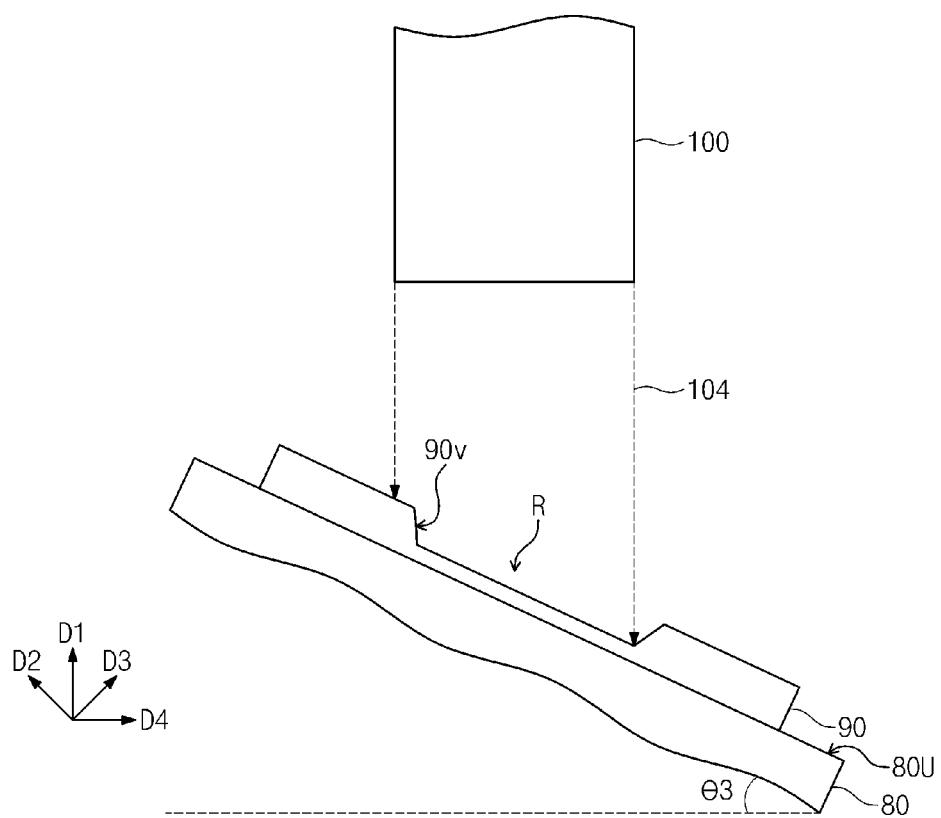

FIGS. 5A and 5B are example schematic diagrams illustrating relation between a movement of the stage and a variation in section of a sample wafer to be measured by the image acquisition unit.

Referring to FIG. 5A, the sample wafer 90 may be loaded on the top surface 80U of the stage 80. The sample wafer 90 may be interposed between the image acquisition unit 100 and the stage 80. The sample wafer 90 may include a recess region R, which is formed by etching a surface of the sample wafer 90 using the ion beam milling unit 110. The image acquisition unit 100 may be configured to irradiate the electron beam 104 onto the etched surface of the sample wafer 90 and acquire an image of a bottom surface 90h of the recess region R. As described with reference to FIG. 4, the stage 80 may be movable in the first or vertical direction D1, and thus, a distance d between the image acquisition unit 100 and the sample wafer 90 can be adjusted.

Referring to FIG. 5B, the stage 80 may rotate about the rotating axis 80r in a clockwise or counterclockwise direction by the third angle $\theta 3$, as described with reference to FIG. 3. Because the sample wafer 90 also rotates about the rotating axis 80r by the third angle $\theta 3$, the image acquisition unit 100 may acquire an image of an inner sidewall 90v of the recess region R using the electron beam 104 irradiated onto the etched surface of the sample wafer 90.

Referring back to FIG. 1, the semiconductor inspection system 500 may include a computer system 200 coupled to the ion beam milling unit 110, the image acquisition unit 100, and the mass spectrometry unit 120. The computer system 200 may be configured to process data obtained using the ion beam milling unit 110, the image acquisition unit 100, and the mass spectrometry unit 120. The computer system 200 may include a controller 210 for processing data and a storage device 220 for storing data. The storage device 220 may include a non-volatile data-storage medium. For example, the storage device 220 may include, for example, a hard disk drive and/or a non-volatile semiconductor memory device (such as FLASH memory devices, phase-changeable memory devices, and/or magnetic memory devices). The functions of the controller 210 and the storage device 220 will be described in more detail below. Further, the computer system 200 may further include an input/output unit 230 and an interface unit 240. The input/output unit 230 may include, for example, at least one of a keyboard, a keypad, and/or a display device. Data obtained using the ion beam milling unit 110, the image acquisition unit 100, and the mass spectrometry unit 120 may be transmitted to the computer system 200 via the interface unit 240. Further, data processed in the computer system 200 may be transmitted to the ion beam milling unit 110, the image acquisition unit 100, and the mass spectrometry unit 120 via the interface unit 240. The interface unit 240 may include, for example, a wired element, a wireless element, a universal serial bus (USB) port, and so forth. The controller 210, the storage device 220, the input/output unit 230, and the interface unit 240 may be coupled to each other via, for example, at least one data bus. The semiconductor inspection system 500 may be used to execute an inspection process on a semiconductor device. Hereinafter, a method of inspecting a semiconductor device will be described.

Figure 6:
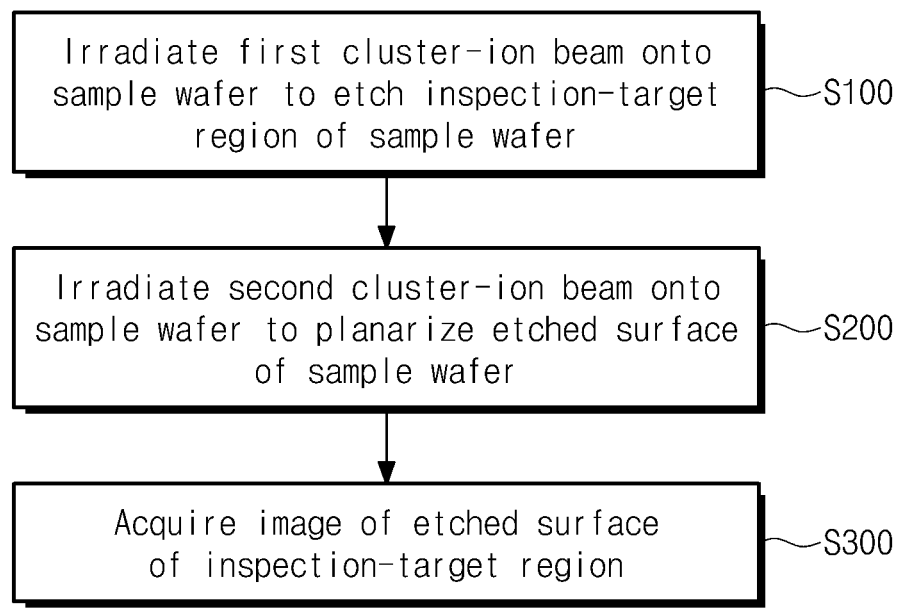
FIG. 6 is a flow chart illustrating a method of inspecting a semiconductor device according to an example embodiment of the inventive concepts.
Figure 7:
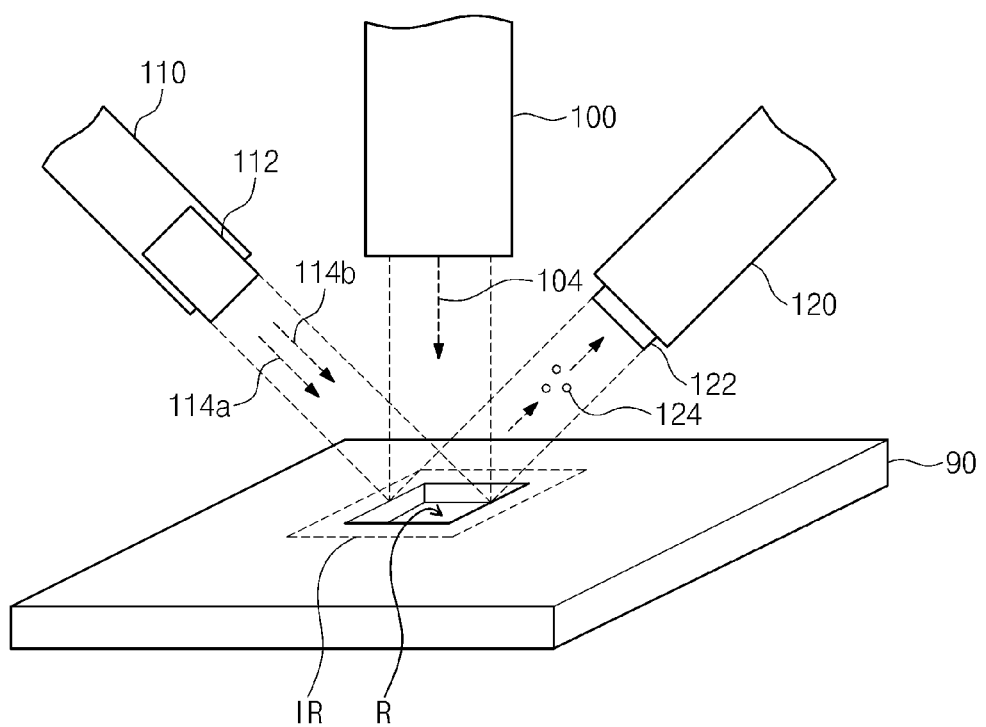
FIG. 7 is a schematic diagram illustrating a method of inspecting a semiconductor device according to an example embodiment of the inventive concepts.
Figure 8A:
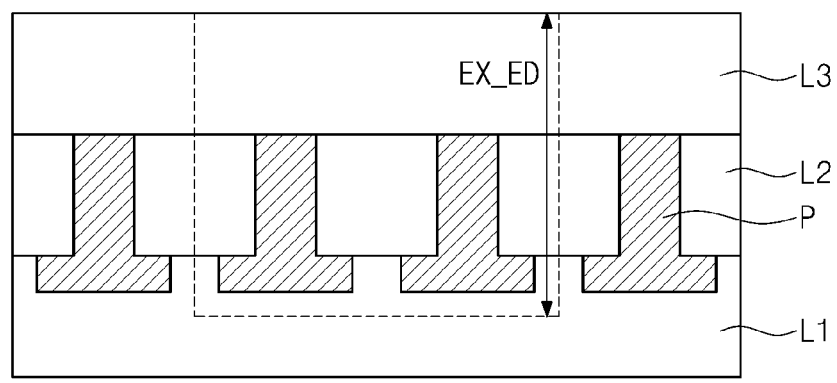
FIGS. 8A and 8B are example sectional views illustrating vertical cross-sections of a sample wafer to be inspected by an inspection method according to an example embodiment of the inventive concepts.
Figure 8B:
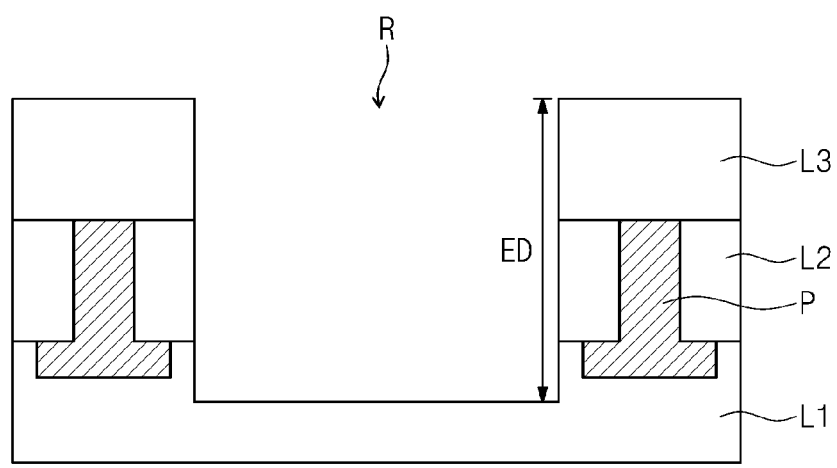

FIG. 6 is a flow chart illustrating a method of inspecting a semiconductor device according to an example embodiment of the inventive concepts, and FIG. 7 is a schematic diagram illustrating a method of inspecting a semiconductor device according to an example embodiment of the inventive concepts. FIGS. 8A and 8B are example sectional views illustrating vertical cross-sections of a sample wafer to be inspected by an inspection method according to an example embodiment of the inventive concepts.

Referring to FIGS. 1 and 8A, a sample wafer 90 may be provided in the vacuum chamber 10 of the semiconductor inspection system 500. For example, the sample wafer 90 may be loaded on the stage 80 provided in the vacuum chamber 10. The sample wafer 90 may include a plurality of patterns constituting a semiconductor device. As an example, as shown in FIG. 8A, the sample wafer 90 may include first, second, and third layers L1, L2, and L3, which are sequentially stacked, and patterns P penetrating at least one of the first to third layers L1, L2, and L3. At least one of the first to third layers L1, L2, and L3 may include a material different from the others.

Referring to FIGS. 6, 7, and 8B, a first cluster-ion beam 114a may be irradiated onto a surface of the sample wafer 90 to etch an inspection-target region IR of the sample wafer 90 (in S100). As a result of the etching of the inspection-target region IR, a recess region R may be formed in the sample wafer 90. In some example embodiments, as shown in FIG. 8B, the etching of the inspection-target region IR may be performed in such a way that the first layer L1 is exposed by the recess region R. The first layer L1 may include a material capable of serving as an etch stop layer to the first cluster-ion beam 114a, and in this case, the etching of the inspection-target region IR may be controlled using the first layer L1 as the etch stop layer.

For example, the first cluster-ion beam 114a emitted from the emitting part 112 of the ion beam milling unit 110 described with reference to FIG. 1 may be irradiated onto the surface of the inspection-target region IR of the sample wafer 90. The first cluster-ion beam 114a may be a cluster of charged ions (e.g., Ar+, Cu+, or Cs+). The cluster of the charged ions may be accelerated toward the surface of the inspection-target region IR and may be collided with the surface to form scattered ion clusters. The scattering of the charged ions makes it possible to distribute the energy of the charged ions over a wide region of the incident surface and consequently to perform a milling process on a relatively large area of the inspection-target region IR. Further, due to the scattering of the charged ions, an energy of the scattered ion clusters may be delivered to a shallow depth of the inspection-target region IR. Thus, the milling process on the inspection-target region IR may be performed in a precise manner.

When the inspection-target region IR is etched or milled by the first cluster-ion beam 114a, etch residues or secondary ions 124 may be produced from the surface of the inspection-target region IR. In some example embodiments, the irradiation of the first cluster-ion beam 114a may be controlled based on analysis of the secondary ions 124. For example, if the etch stop material is detected from the secondary ions 124, the etching or milling of the inspection-target region IR may be terminated or performed in a reduced beam intensity.

Figure 9:
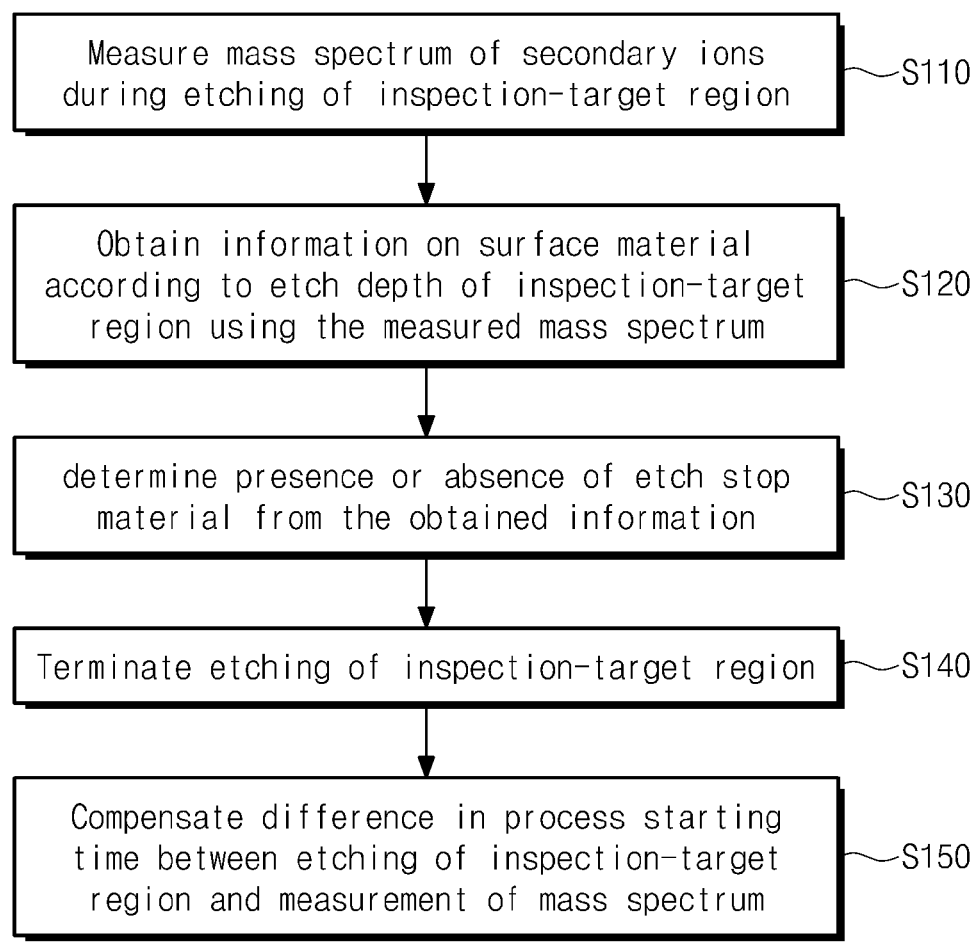
FIG. 9 is a flow chart illustrating in more detail the step S100 of FIG. 6.
Figure 10:
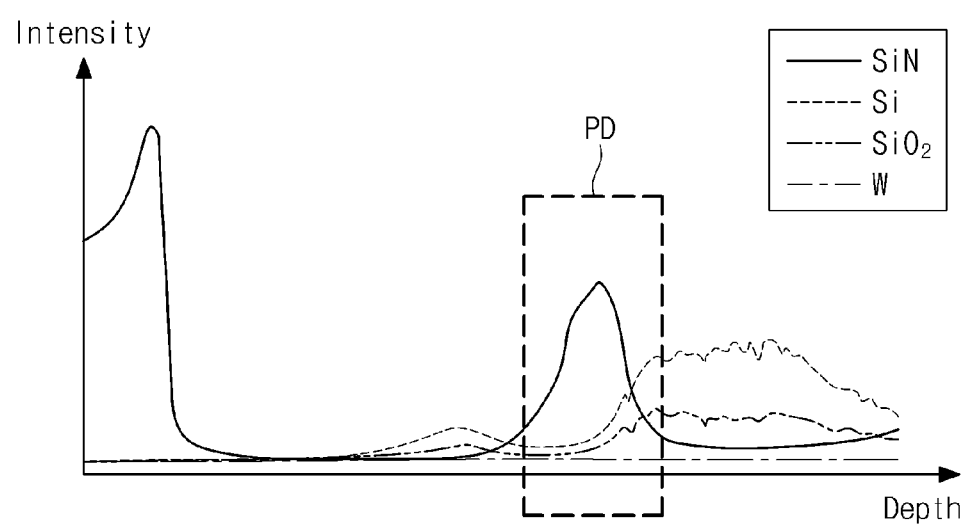
FIG. 10 is a graph showing a variation in detection intensity of each material constituting a surface of an inspection-target region that is obtained using an inspection method according to an example embodiment of the inventive concepts according to an etch depth of the inspection-target region.
Figure 11A:
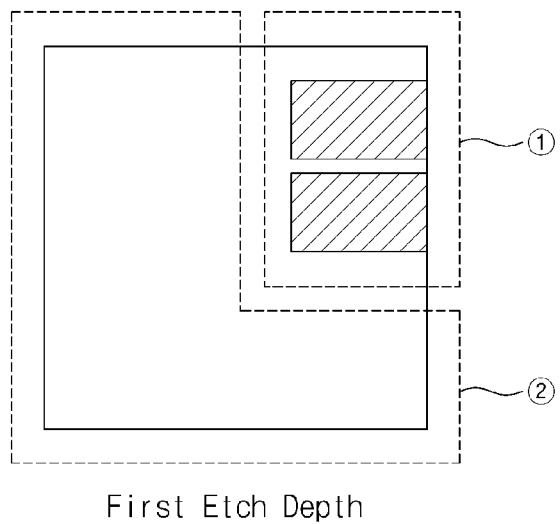
FIGS. 11A and 11B are schematic diagrams illustrating mass distribution images of a surface material that are obtained at two different etch depths of an inspection-target region using an inspection method according to an example embodiment of the inventive concepts.
Figure 11B:
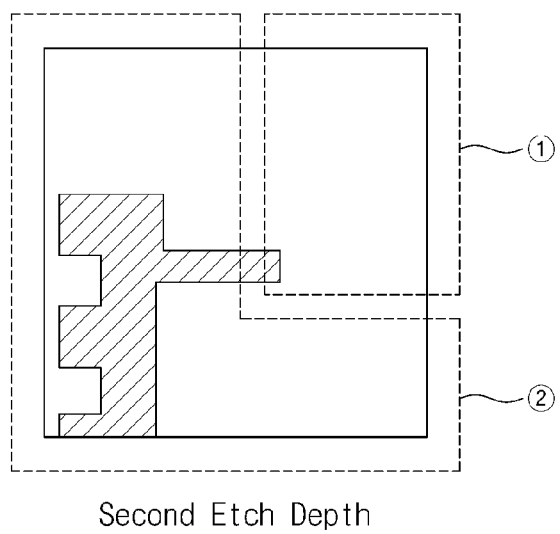

FIG. 9 is a flow chart illustrating in more detail the step S100 of FIG. 6. FIG. 10 is a graph showing a variation in detection intensity of each material constituting a surface of an inspection-target region that is obtained using an inspection method according to an example embodiment of the inventive concepts according to an etch depth of the inspection-target region. FIGS. 11A and 11B are schematic diagrams illustrating mass distribution images of a surface material that are obtained at two different etch depths of an inspection-target region using an inspection method according to an example embodiment of the inventive concepts.

Referring to FIGS. 7 and 9, during the etching of the surface of the inspection-target region IR, the secondary ions 124 may be collected by the detecting part 122 of the mass spectrometry unit 120 described with reference to FIG. 1, and a mass spectrum of the secondary ions 124 may be measured by the mass spectrometry unit 120 (in S110). For example, the mass spectrometry unit 120 may be a quadrupole mass spectrometer, but example embodiments of the inventive concepts may not be limited thereto. The mass spectrum may be measured in real-time while the surface of the inspection-target region IR is etched, and this makes it possible to collect mass spectrum data according to an etch depth of the inspection-target region IR.

The mass spectrum data according to the etch depth of the inspection-target region IR may be used to obtain information on a surface material removed from the inspection-target region IR according to the etch depth (in S120). The obtaining of the information on the surface material may include analyzing the mass spectrum data to find out ingredients of the surface material according to the etch depth of the inspection-target region IR and obtaining a variation in detection intensity of a material, which is corresponding to a mass-to-charge ratio obtained from the mass spectrum data, according to the etch depth of the inspection-target region IR. The ingredients of the surface material and the detection intensity of the material corresponding to the mass-to-charge ratio may be obtained as function of the etch depth of the inspection-target region IR. For example, an experiment including the steps S110 and S120 of FIG. 9 may be performed on a reference wafer, and then, as shown in FIG. 10, ingredients of a surface material removed from the inspection-target region may be analyzed according to an etch depth of the inspection-target region. FIG. 10 shows a portion composed of silicon nitride (SiN), silicon (Si), silicon oxide (SiO2), and tungsten (W), at an etch depth denoted by the reference numeral PD. Further, comparison of the detection intensities shows that at the etch depth PD, the detection intensity of silicon nitride (SiN) may be significantly larger than those of the other materials.

When the information on the surface material is obtained, a process may be further performed to obtain a mass distribution image of the material corresponding to a specific mass-to-charge ratio. The mass distribution image may be an image showing a two-dimensional distribution of detection intensities of the material corresponding to a specific mass-to-charge ratio. Such a mass distribution image may be obtained according to the etch depth of the inspection-target region IR. For example, as illustrated in FIGS. 11A and 11B, mass distribution images can be obtained at two different etch depths of the inspection-target region of the reference wafer. FIG. 11A shows that, at a first etch depth of the inspection-target region of the reference wafer, a specific material is mainly distributed in a first position ① of the inspection-target region. By contrast, FIG. 11B shows that at the second etch depth of the inspection-target region, the specific material is mainly distributed in a second position ② that is different from the first position ①. In other words, by using the mass distribution image, it is possible to analyze distribution of the specific material in terms of in-plane position and vertical depth of the inspection-target region.

The information obtained from the surface material may be stored in the storage device 220 of the computer system 200 described with reference to FIG. 1.

Figure 12:
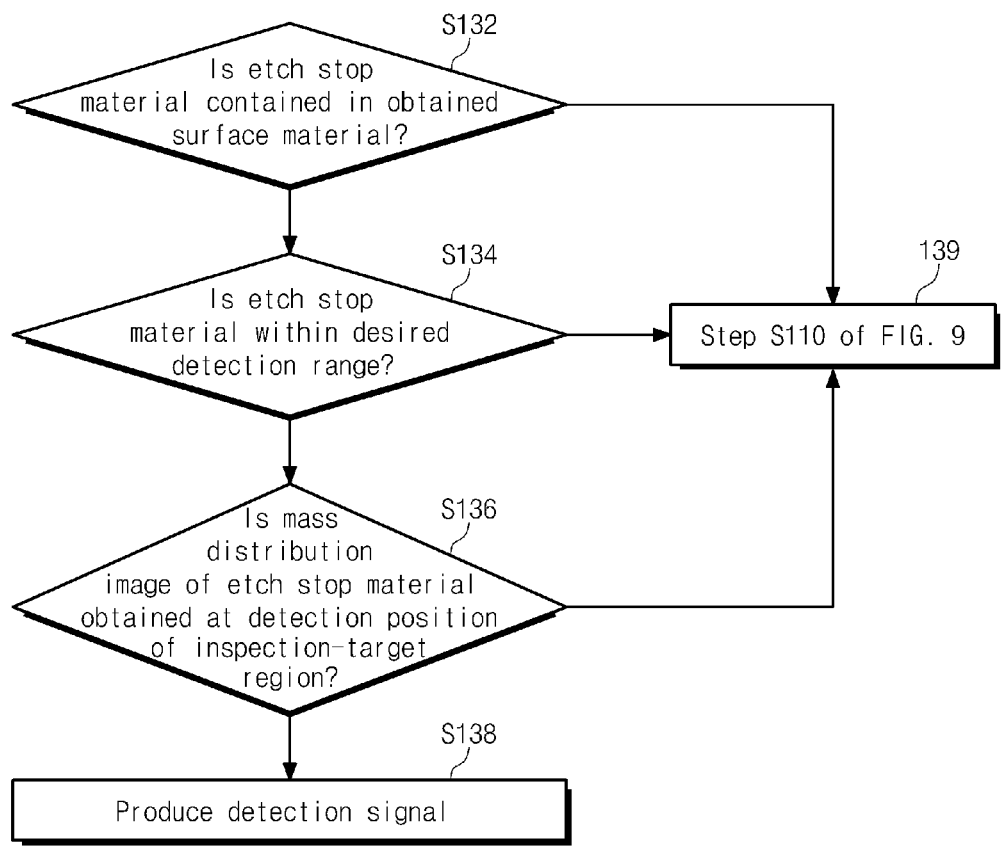
FIG. 12 is a flow chart illustrating in more detail the step S130 of FIG. 9.
Figure 13:
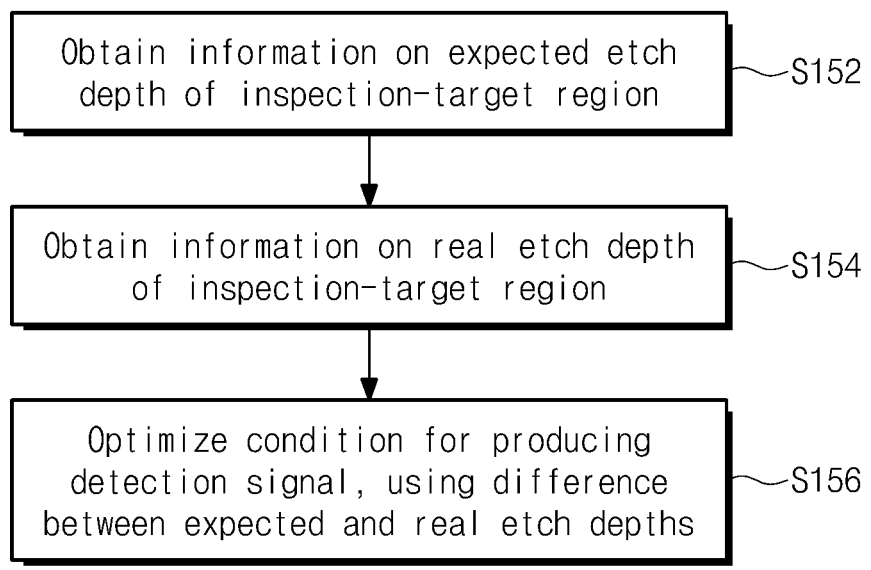
FIG. 13 is a flow chart illustrating in more detail the step S150 of FIG. 9.

FIG. 12 is a flow chart illustrating in more detail the step S130 of FIG. 9, and FIG. 13 is a flow chart illustrating in more detail the step S150 of FIG. 9.

Referring to FIGS. 9 and 12, the obtained information may be analyzed to detect the etch stop material or determine the presence or absence of the etch stop material (in S130). The etch stop material may be empirically determined by performing the steps S110 and S120 of FIG. 9 on the reference wafer. The reference wafer may be prepared to have the same layers and patterns as the sample wafer. For example, as described with reference to FIG. 10, a material (e.g., silicon nitride) having the highest detection intensity at a specific etch depth PD may be selected as the etch stop material. In other example embodiments, as described with reference to FIGS. 11A and 11B, in the case where a mass distribution image of a specific material shows that the specific material is mainly distributed at a predetermined etch depth and a predetermined region of the inspection-target region, the specific material may be selected as the etch stop material.

The detection of the etch stop material may be performed by the controller 210 of the computer system 200 described with reference to FIG. 1.

For example, the controller 210 may determine whether the etch stop material exists in the obtained surface material (in S132). If the etch stop material is not detected in the obtained surface material, the inspection process may be returned to the step S110 of FIG. 9 to further etch the inspection-target region IR again (in S139).

If the etch stop material is detected in the obtained surface material, a step may be performed to determine whether it is within a desired (or alternatively, predetermined) detection range (in S134). The detection range may be determined in an empirical manner. For example, as illustrated in FIG. 10, the detection range may be selected to include or be a range, in which the detection intensity of the etch stop material (e.g., silicon nitride) is highest. If the detection intensity of the etch stop material is out of the detection range, the inspection process may be returned to the step S110 of FIG. 9 to further etch the inspection-target region IR again (in S139).

If the detection intensity of the etch stop material is within the detection range, a step may be performed to determine whether a mass distribution image of the etch stop material is obtained at a detection position of the inspection-target region IR (in S136). The detection position may be determined in an empirical manner. For example, as illustrated in FIGS. 11A and 11B, the detection position may be selected to be or include a region, in which the etch stop material is mainly contained. Further, the detection position may be defined as a function of an etch depth in the inspection-target region IR. For example, in the case of FIG. 11A, the detection position may be selected as the first position C) for the first etch depth. If the mass distribution image of the etch stop material is not obtained at the desired detection position of the inspection-target region IR, the inspection process may be returned to the step S110 of FIG. 9 to further etch the inspection-target region IR again (in S139).

If the mass distribution image of the etch stop material is obtained at the desired detection position of the inspection-target region IR, a detection signal for notifying detection of the etch stop material may be produced (in S138).

Referring back to FIGS. 7, 8B, and 9, if the detection signal of the etch stop material is produced, the ion beam milling unit 110 may be controlled by the controller 210 to terminate the etching of the inspection-target region IR (in S140). When the etching of the inspection-target region IR is terminated, as shown in FIG. 8B, the recess region R may be formed in the sample wafer 90 to expose the first layer L1. When the etching of the inspection-target region IR is terminated, an intensity of the beam current of the first cluster-ion beam 114a may be decreased in a gradual or stepwise manner.

Referring to FIGS. 7, 8A, 8B, 9, and 13, in the step S110 of FIG. 9, there may be a difference in process starting time between the etching of the inspection-target region IR and the measurement of the mass spectrum of the secondary ions 124. In this case, as illustrated in FIGS. 8A and 8B, an expected etch depth Ex_ED of the inspection-target region IR, which is obtained based on the detection signal of the etch stop material, may differ from a real etch depth ED of the inspection-target region IR, which is determined by terminating the etching of the inspection-target region IR. To reduce such a difference between the expected and real etch depths, a step for compensating the difference in process starting time between the etching of the inspection-target region IR and the measurement of the mass spectrum of the secondary ions 124 may be performed.

For example, information on the expected etch depth Ex_ED of the inspection-target region IR when the detection signal is produced, may be obtained (in S152). The expected etch depth Ex_ED may be obtained by theoretically or empirically analyzing a structure of the layers L1, L2, and L3 and the patterns P provided in the sample wafer 90. As an example, if the first layer L1 contains the etch stop material, the expected etch depth Ex_ED may be given as illustrated in FIG. 8A.

Information on the real etch depth ED of the inspection-target region IR when the detection signal is produced, may be obtained (in S154). The real etch depth ED may be obtained by performing the steps S110 to S140 of FIG. 9 on the reference wafer, which has the same layers and patterns as the sample wafer 90, and then performing a destructive inspection process on the reference wafer. The destructive inspection on the reference wafer may be performed using, for example, a scanning electron microscope (SEM). As an example, the real etch depth ED may be given as illustrated in FIG. 8B.

By using the difference between the expected etch depth Ex_ED and the real etch depth ED, a condition for producing the detection signal, which is described with reference to the step S130 of FIG. 9 (in S156) may be optimized. For example, the detection range, as described with reference to the step S134 of FIG. 12, may be adjusted in such a way that the difference between the expected etch depth Ex_ED and the real etch depth ED is minimized.

Referring again to FIGS. 6, 7, and 8B, if the etching of the inspection-target region IR of the sample wafer 90 is terminated, a second cluster-ion beam 114b may be irradiated onto the etched surface (i.e., an inner surface of the recess region R) of the inspection-target region IR to planarize the etched surface (in S200). For example, the second cluster-ion beam 114b may be irradiated from the emitting part 112 of the ion beam milling unit 110 onto the etched surface of the inspection-target region IR. The second cluster-ion beam 114b may be a cluster of charged ions having a lower energy than that of the first cluster-ion beam 114a. As a result of the irradiation of the second cluster-ion beam 114b onto the etched surface of the inspection-target region IR, the etched surface may be planarized to have a reduced surface roughness.

An electron beam 104 may be irradiated onto the etched surface of the inspection-target region IR to acquire an image of the etched surface (in S300). For example, the image acquisition unit 100 described with reference to FIG. 1 may irradiate the electron beam 104 on the etched surface with and collect electrons emitted from the etched surface to form an image of the etched surface. In some example embodiments, the image acquisition unit 100 may be a scanning electron microscope (SEM).

According to some example embodiments of the inventive concepts, a destructive inspection system may be provided. The destructive inspection system may include a cluster-ion beam milling unit, an image acquisition unit, and a mass spectrometry unit, which are accommodated in one chamber. In the destructive inspection system according to an example embodiment, a cluster-ion beam may be used to etch or mill a surface of an inspection-target region of a sample wafer. Thus, a milling process on a large-area region of the inspection-target region may be performed in a precise manner. Further, the image acquisition unit may be used to acquire an image of the etched surface. As a result, the inspection system according to some example embodiments of the inventive concepts may allow a user to perform a relatively high-speed destructive inspection over a relatively large area.

Further, when the surface of the inspection-target region is etched using the cluster-ion beam milling unit according to an example embodiment, the mass spectrometry unit may be used to determine whether an etch stop material is contained in the etched surface of the inspection-target region or to determine a termination point of the milling process. Accordingly, resolution and reliability of the destructive inspection process may be improved.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor inspection system, comprising:
    an ion beam milling unit configured to irradiate at least one cluster-ion beam onto a surface of a sample wafer and etch the surface of the sample wafer;
    a mass spectrometry unit configured to measure a mass spectrum of secondary ions from the sample wafer, while the surface of the sample wafer is etched;
    a controller configured to,
        detect an etch stop material by analyzing the secondary ions measured by the mass spectrometry unit,
        generate, considering a time difference between the etching by the ion beam milling unit and the measuring by the mass spectrometry unit, a detection signal when a detected intensity of the etch stop material reaches a threshold, and
        control, in response to the detection signal, the ion beam milling unit to terminate the etching; and
    an image acquisition unit configured to irradiate an electron beam onto the etched surface of the sample wafer and acquire an image of the etched surface.

2. The system of claim 1, wherein the ion beam milling unit is configured to irradiate a plurality of cluster-ion beams including the at least one cluster-ion beam, the cluster-ion beams including a first cluster-ion beam and a second cluster-ion beam, the first cluster-ion beam is used to etch the surface of the sample wafer, and
    the second cluster-ion beam has an energy lower than that of the first cluster-ion beam and is used to planarize the etched surface of the sample wafer.

3. The system of claim 1, wherein the image acquisition unit is a scanning electron microscope (SEM).

4. The system of claim 1, wherein the mass spectrometry unit is a quadrupole mass spectrometer.

5. The system of claim 1, further comprising:
    a vacuum chamber configured to accommodate the ion beam milling unit, the image acquisition unit, and the mass spectrometry unit therein.

6. The system of claim 5, further comprising:
    a stage in the vacuum chamber and configured to receive the sample wafer,
    wherein the image acquisition unit is over a top surface of the stage and spaced apart from the stage in a first direction.

7. The system of claim 6, wherein the ion beam milling unit is over the top surface of the stage and is configured to incline with respect to the top surface of the stage in a second direction, the second direction inclined at a first angle with respect to the first direction.

8. The system of claim 7, wherein the mass spectrometry unit is over the top surface of the stage and is configured to incline with respect to the top surface of the stage in a third direction, the third direction inclined at a second angle with respect to the first direction, and
    the image acquisition unit is between the ion beam milling unit and the mass spectrometry unit.

9. The system of claim 8, wherein the ion beam milling unit and the mass spectrometry unit are arranged in a fourth direction that is orthogonal to the first direction,
    the fourth direction is inclined with respect to the second and third directions, and
    the stage is configured to have a rotating axis in the fourth direction and be rotatable about the rotating axis within a specific angle range.

10. The system of claim 8, wherein the stage is movable in the first direction.

11. The system of claim 5, further comprising:
    a wafer handling unit associated with the vacuum chamber.

12. The system of claim 11, further comprising:
    a load-lock chamber connecting the vacuum chamber to the wafer handling unit, wherein the wafer handling unit includes a load port and a robot system, the load port configured to load the sample wafer supplied from an outside therein, and
    the robot system configured to deliver the sample wafer loaded in the load port to the load-lock chamber.

13. The system of claim 1, wherein the controller is configured to generate the detection signal by,
    obtaining first information on an expected etch depth of the sample wafer, obtaining second information on a real etch depth of the sample wafer through the mass spectrometry unit, determining a depth difference between the expected etch depth and the real etch depth based on the first and second information, and generating the detection signal based on the depth difference information.

14. A semiconductor inspection system, comprising:

an ion beam milling unit configured to etch an inspection-target region of a sample wafer by irradiating a first cluster-ion beam thereon and planarize a surface of the inspection-target region by irradiating a second cluster-ion beam thereon;

an image acquisition unit configured to acquire an image of the planarized surface of the sample wafer by irradiating an electron beam thereon; and a mass spectrometry unit configured to measure a mass spectrum of secondary ions from a surface of the sample wafer, while the surface of the sample wafer is etched, a controller configured to compensate a time difference between the etching of the inspection-target region of the sample wafer and the measuring of the secondary ions from the surface of the sample wafer based on a difference between an expected etch depth and a real etch depth of the inspection-target region.

15. The system of claim 14, further comprising: a controller configured to detect an etch stop material from the mass spectrum of secondary electrons measured by the mass spectrometry unit and control the ion beam milling unit such that the etching of the sample wafer is terminated when a detected intensity of the etch stop material is within a detection range.

16. The system of claim 14, wherein the second cluster-ion beam has an energy lower than that of the first cluster-ion beam.

17. The system of claim 14, further comprising:

a stage configured to receive the sample wafer thereon, wherein the ion beam milling unit, the image acquisition unit, and the mass spectrometry unit, are arranged over the stage in a first direction.

18. The system of claim 17, wherein the stage is configured to move in a second direction perpendicular to the first direction.

* * * * *